(12) United States Patent
Noguchi et al.

(10) Patent No.: US 6,398,892 B1
(45) Date of Patent: Jun. 4, 2002

(54) METHOD OF USING PRESSURE SENSITIVE ADHESIVE DOUBLE COATED SHEET

(75) Inventors: Hayato Noguchi, Urawa; Yoshihisa Mineura, Tokyo; Kazuyoshi Ebe, Shiraoka-machi, all of (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/382,965

(22) Filed: Aug. 25, 1999

(30) Foreign Application Priority Data

Aug. 26, 1998 (JP) .............................. 10-240170
Apr. 16, 1999 (JP) .............................. 11-109806

(51) Int. Cl.⁷ .............................................. B32B 31/00

(52) U.S. Cl. .................... 156/85; 156/248; 156/154; 156/275.5; 156/306.9; 156/344

(58) Field of Search ................. 438/118, 459, 438/464; 156/85, 248, 154, 275.5, 275.7, 306.9, 344; 428/136, 345, 354; 29/426.1, 426.2, 426.4, 426.5, 426.6, 603.17

(56) References Cited

U.S. PATENT DOCUMENTS

| | | | |
|---|---|---|---|
| 4,729,971 A | * 3/1988 | Coleman | 437/226 |
| 4,965,127 A | 10/1990 | Ebe et al. | 428/343 |
| 5,476,566 A | * 12/1995 | Cavasin | 156/249 |
| 5,534,102 A | * 7/1996 | Kadono et al. | 156/250 |
| 5,714,029 A | 2/1998 | Uemura et al. | 156/275.5 |
| 6,176,966 B1 | * 1/2001 | Tsujimoto et al. | 156/344 |

FOREIGN PATENT DOCUMENTS

| | | |
|---|---|---|
| EP | 0157508 | 10/1985 |
| JP | 60196956 | 10/1985 |
| JP | 60223139 | 11/1985 |
| JP | 05-32946 | 2/1993 |
| JP | 7062304 | 3/1995 |
| JP | 08-27239 | 1/1996 |

* cited by examiner

*Primary Examiner*—Jeff H. Aftergut
*Assistant Examiner*—Gladys Piazza
(74) *Attorney, Agent, or Firm*—Webb Ziesenheim Logsdon Orkin & Hanson, P.C.

(57) ABSTRACT

Disclosed herein is a pressure sensitive adhesive double coated sheet comprising a shrink substrate and, superimposed on both sides thereof, pressure sensitive adhesive layers, at least one of the pressure sensitive adhesive layers being composed of an energy radiation curable pressure sensitive adhesive. The pressure sensitive adhesive double coated sheet according to the invention enables efficiently processing a work piece with high precision. In particular the pressure sensitive adhesive double coated sheet is suitable to a process capable of producing IC chips of high thickness precision with high yield by reducing warpage and minimizing carrying breakage in the grinding of extremely thin or large diameter silicon wafers and capable of performing back grinding and dicing in the same configuration. Further, the invention provides a process of producing semiconductors of high reliability in which the above pressure sensitive adhesive double coated sheet is used.

14 Claims, 3 Drawing Sheets

METHOD OF USING PRESSURE SENSITIVE ADHESIVE DOUBLE COATED SHEET

FIELD OF THE INVENTION

The present invention relates to a pressure sensitive adhesive double coated sheet. More particularly, the present invention relates to a pressure sensitive adhesive double coated sheet for use in processing or protecting a brittle work piece temporarily held on a hard plate.

BACKGROUND OF THE INVENTION

In recent years, the spread of IC cards is being promoted, and accordingly the reduction of the thickness thereof is demanded. Thus, it is now needed to reduce the thickness of semiconductor chips from the conventional about 350 $\mu$m to 50–100 $\mu$m or less.

It is common practice to grind a wafer back after the formation of a circuit pattern on a wafer surface. The grinding of the wafer back is performed while a pressure sensitive adhesive sheet is stuck to the circuit surface to thereby protect the circuit surface and fix the wafer. Pressure sensitive adhesive sheets comprising a soft substrate coated with a pressure sensitive adhesive are commonly employed in this use. However, in these pressure sensitive adhesive sheets based on a soft substrate, the tension applied at the adhesion is stored as a residual stress. When the wafer has a large diameter or is ground to an extremely small thickness, the residual stress of the pressure sensitive adhesive sheet surpasses the strength of the wafer with the result that the wafer is warped by the force exerted to cancel the residual stress. Further, after the grinding, the brittleness of the wafer, when supported by a soft substrate, has caused wafer breakage during the carrying of the wafer. Therefore, a method comprising fixing the wafer on a hard material such as a quartz plate or an acrylic plate and grinding the wafer is being studied.

In order to cut a hard brittle material such as a printer head, a glass/epoxy base plate, a glass or a ceramic into small chips, the cutting is performed after fixing the hard brittle material on a hard support material. Pressure sensitive adhesive double coated sheets are used for fixing such a cut piece on a hard support material. However, it is extremely difficult to separate the two hard materials mutually stuck with the conventional pressure sensitive adhesive double coated sheet from each other. When a very brittle material such as a wafer is used, it has been unfeasible to be free from damaging thereof.

Therefore, there is a demand for the development of a pressure sensitive adhesive double coated sheet suitable for fixing any of semiconductor wafers and the above-mentioned various cut pieces on a hard material.

Moreover, in the processing of semiconductor wafers, a surface protective sheet and a pressure sensitive adhesive sheet for fixing a wafer are required during the back grinding and the dicing, respectively. This has been burden some from the view point of process control. Further, the brittleness of the wafer has caused wafer breakage during the carrying of the wafer between the above process steps.

Therefore, there is also a demand for the development of a process enabling performing a sequence of process steps including the above wafer back grinding, dicing and carrying in the same configuration, enabling facilitating a process control and enabling preventing wafer breakage.

The present invention has been made in view of the above state of the prior art. The present invention provides a pressure sensitive adhesive double coated sheet which enables efficiently processing a work piece with high precision, in particular a pressure sensitive adhesive double coated sheet suitable to a process capable of producing IC chips of high thickness precision with high yield by reducing warpage and minimizing carrying breakage in the grinding of extremely thin or large diameter silicon wafers and capable of performing back grinding and dicing in the same configuration. It addition, the present invention provides a process of producing semiconductors of high reliability in which use is made of the above pressure sensitive adhesive double coated sheet.

SUMMARY OF THE INVENTION

The pressure sensitive adhesive double coated sheet of the present invention comprises a shrink substrate and, superimposed on both sides thereof, pressure sensitive adhesive layers, at least one of the pressure sensitive adhesive layers being composed of an energy radiation curable pressure sensitive adhesive.

In the present invention, it is preferred that both of the pressure sensitive adhesive layers be composed of an energy radiation curable pressure sensitive adhesive. Further, it is preferred that the shrink substrate be furnished with a multiplicity of minute cuts (or notches). The pressure sensitive adhesive double coated sheet of the present invention is preferably used to fix or protect a work piece during processing of the work piece temporarily held on a hard plate.

That is, the pressure sensitive adhesive double coated sheet of the present invention is preferably used in a process comprising the sequence of steps:

sticking a work piece to be processed to one energy radiation curable pressure sensitive adhesive layer of the above pressure sensitive adhesive double coated sheet while sticking the other pressure sensitive adhesive layer to a hard plate so that the work piece is held on the hard plate;

processing the work piece;

irradiating the energy radiation curable pressure sensitive adhesive layer with energy radiation to cure the same and simultaneously shrinking the shrink substrate; and peeling the processed work piece from the energy radiation curable pressure sensitive adhesive layer having been irradiated and cured.

In the above method of use as well, it is preferred that both of the pressure sensitive adhesive layers are composed of an energy radiation curable pressure sensitive adhesive. Further, it is preferred that the shrink substrate be furnished with a multiplicity of minute cuts.

In the above method of use, it is preferred that the work piece is a semiconductor wafer having its surface furnished with a circuit pattern, and the processing being the grinding of the back of the wafer.

The work piece may be a semiconductor wafer having its surface furnished with a circuit pattern, and the processing being dicing of the wafer into element chips.

Further, the work piece may be a semiconductor wafer having its surface furnished with a circuit pattern, and the processing being the grinding of back of the wafer and dicing of the wafer into element chips, these being performed in arbitrary sequence.

The above pressure sensitive adhesive double coated sheet of the present invention enables temporarily holding various work pieces on a hard plate to thereby effect the fixing and protection thereof during processing. Also, the pressure sensitive adhesive double coated sheet of the present invention enables easily peeling the work pieces from the sheet by simple operation after the performing of desired processing and protection. Therefore, even if the pressure sensitive adhesive double coated sheet is used in the grinding of the back of, for example, an extremely thin or large-diameter semiconductor wafer, the wafer thickness precision can be enhanced and the warpage of the wafer can be reduced thereby. Further, the breakage during wafer carrying can be prevented. Consequently, the pressure sensitive adhesive double coated sheet of the present invention enables production of various electronic components and semiconductor chips with high yield.

Moreover, a sequence of steps including processing and carrying can be performed in the same wafer configuration in the present invention, so that the process control can be facilitated.

DETAILED DESCRIPTION OF THE INVENTION

The present invention will be described in detail below with reference to the appended drawings.

Figure 1:
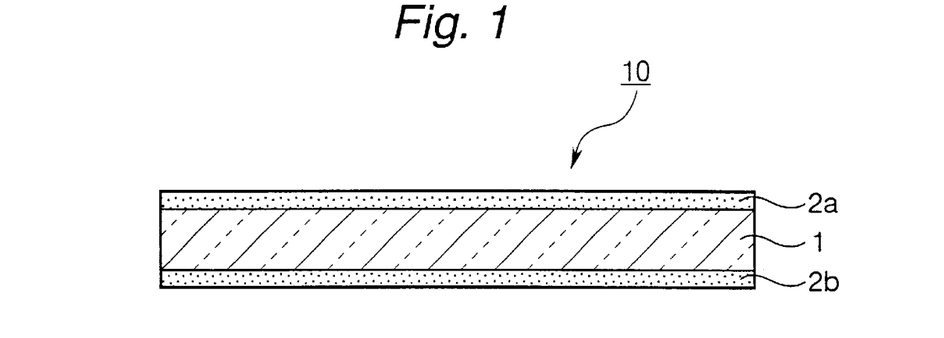
FIG. 1 is a sectional view of the pressure sensitive adhesive double coated sheet of the present invention.

Referring now to FIG. 1, the pressure sensitive adhesive double coated sheet 10 of the present invention comprises shrink substrate 1 and, superimposed on both sides thereof, pressure sensitive adhesive layers 2a and 2b.

Although the shrink substrate 1 is not particularly limited, preferred is a heat shrink film.

The shrinkage ratio of the shrink film for use in the present invention is preferably in the range of 10 to 90%, still preferably 20 to 80%.

The shrinkage ratio (SR) of the shrink film is calculated from the dimension before shrinkage and the dimension after shrinkage by the formula (Dim.=dimension):

$$SR = \frac{(\text{Dim. before shrink}) - (\text{Dim. after shrink})}{(\text{Dim. before shrink})} \times 100$$

When the heat shrink film is used, the above shrinkage ratio values are those calculated from the dimensions of film measured before and after heating at 120° C.

A variety of shrink films are known. Any of various shrink films can generally be used in the present invention as long as any adverse effects such as ionic contamination are not exerted on the work piece. Examples of suitable shrink films include uniaxially or biaxially oriented films of polyethylene terephthalate, polyethylene, polystyrene, polypropylene, nylon, polyurethane, polyvinylidene chloride, polyvinyl chloride and the like.

The thickness of the above shrink film is generally in the range of 5 to 300 $\mu$m, preferably 10 to 200 $\mu$m.

A heat shrink film of polyethylene polypropylene, polyethylene terephthalate or the like is preferably used as the shrink film.

Figure 5:
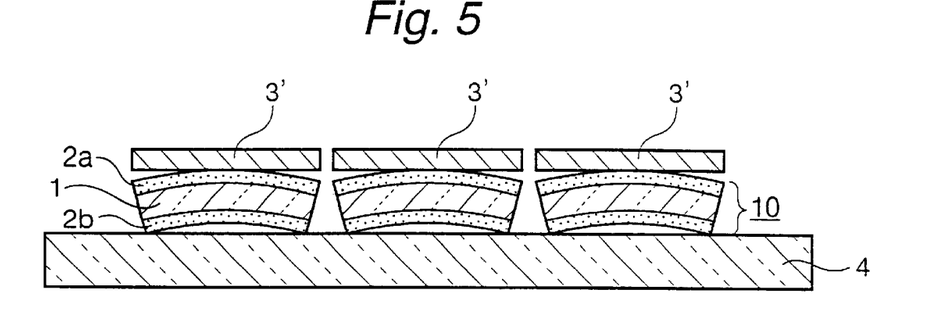
FIG. 5 is a view showing the state of composite after irradiation with energy radiation and after substrate shrinkage.
Figure 10:
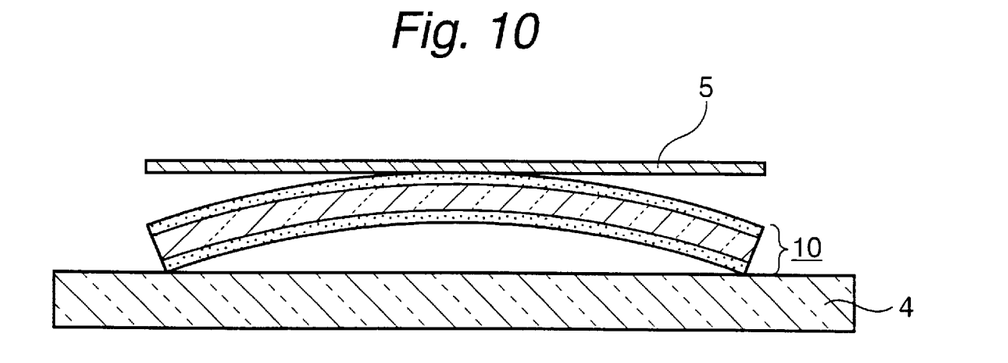
FIG. 10 is a view showing the state of composite after irradiation with energy radiation and after substrate shrinkage.

The shrink film may be a monolayer of any of the above various shrink films or a laminate of shrink films selected from among those listed above. When the shrink film is a laminate, it is preferred that the laminate be composed of films whose shrinkage ratios are different from each other. When the laminate composed of films whose shrinkage ratios are different from each other is used as the shrink substrate 1, a protrudent transformation is likely to occur toward a lower shrinkage ratio side as shown in FIGS. 5 and 10, so that the sticking of the work piece is only made by point contacts to thereby greatly facilitate the peeling of the work piece.

The shrink film for use as the shrink substrate 1 may be furnished with a multiplicity of minute cuts (or notches).

The cut intervals (cutting pitches) are determined depending on the size of each work piece. The cuts are provided at pitches of preferably 0.01 to 2 times and still preferably 0.1 to 1 times the maximum length of bottom face of the work piece. It is generally preferred that the cutting pitches be in the range of 0.1 to 20 mm, especially 1 to 10 mm.

The cut configuration is not particularly limited. For example, the cut pattern may be any of grating, concentric circle and radial forms or a combination thereof. Also, the cuts may have any random configuration. The cuts may be provided over an entire surface of the shrink substrate 1.

In the use of the pressure sensitive adhesive double coated sheet 10 of the present invention, as described later, the energy radiation curable pressure sensitive adhesive layer is irradiated with energy radiation after appropriate steps. When ultraviolet light is used as the energy radiation, all the films constituting the shrink substrate 1 should be permeable for ultraviolet light.

The pressure sensitive adhesive double coated sheet 10 of the present invention comprises the above shrink substrate 1 and, superimposed on both sides thereof, pressure sensitive adhesive layers 2a, 2b, at least one (one or both) of the pressure sensitive adhesive layers being composed of an energy radiation curable pressure sensitive adhesive. In particular, it is desirable for the pressure sensitive adhesive layer 2a provided on the side to which the work piece is stuck to be composed of an energy radiation curable pressure sensitive adhesive. The other pressure sensitive adhesive layer 2b, namely the pressure sensitive adhesive layer provided on the side stuck to a hard plate, although not particularly limited, is preferably composed of an energy radiation curable pressure sensitive adhesive.

When both the pressure sensitive adhesive layers 2a, 2b are composed of energy radiation curable pressure sensitive adhesives, these energy radiation curable pressure sensitive adhesives are preferably selected so that the elastic modulus of pressure sensitive adhesive layer 2a having been cured (elastic modulus 2a) is higher than the elastic modulus of pressure sensitive adhesive layer 2b having been cured (elastic modulus 2b). The elastic modulus 2a is preferably at least two times the elastic modulus 2b, still preferably at least five times the elastic modulus 2b.

The above selection of the elastic moduli of pressure sensitive adhesives 2a, 2b having been cured promotes the transformation of pressure sensitive adhesive double coated sheet 10 caused by the shrinkage of the shrink substrate 1 and facilitates the protrudent transformation of the sheet on the work piece side of the pressure sensitive adhesive layer 2a so that the sticking of the work piece is only made by point contacts to thereby greatly ease the peeling of the work piece.

The energy radiation curable pressure sensitive adhesive generally contains an acrylic pressure sensitive adhesive and an energy radiation polymerizable compound as main components.

For example, low-molecular-weight compounds having in the molecule thereof at least two photopolymerizable carbon to carbon double bonds that can be converted into a three-dimensional network structure by light irradiation as disclosed in Japanese Patent Laid-open Publication Nos. 60(1985)-196,956 and 60(1985)-223,139 are widely used as the energy radiation polymerizable compounds to be incorporated in the energy radiation curable pressure sensitive adhesives. Specific examples thereof include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

Furthermore, besides the above acrylate-based compounds, urethane acrylate-based oligomers can be used as the energy radiation polymerizable compounds. Urethane acrylate oligomers can be obtained by reacting an isocyanate terminated urethane prepolymer which is obtained by coating a polyol compound such as a polyester or polyether compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate with (meth)acrylic ester having a hydroxyl group, such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate.

With respect to the blending ratio of energy radiation polymerizable compound to acrylic pressure sensitive adhesive in the energy radiation curable pressure sensitive adhesive, it is preferred that 50 to 200 parts by weight of the energy radiation polymerizable compound be used per 100 parts by weight of the acrylic pressure sensitive adhesive. In this instance, the initial adhesive strength of the obtained pressure sensitive adhesive sheet is large, and the adhesive strength is sharply dropped upon irradiation of the pressure sensitive adhesive layer with energy radiation. Accordingly, the peeling at the interface of the processed work piece and the acrylic energy radiation curable pressure sensitive adhesive layer is eased to thereby enable picking up of the processed work piece.

The energy radiation curable pressure sensitive adhesive layer 2a may be composed of an energy radiation curable copolymer having an energy radiation polymerizable group as a side chain. This energy radiation curable copolymer exhibits satisfactory adherence and energy radiation curability properties. Details of the energy radiation curable copolymer having an energy radiation polymerizable group as a side chain are described in, for example, Japanese Patent Laid-open Publication Nos. 5(1993)-32,946 and 8(1996)-27,239.

The above acrylic energy radiation curable pressure sensitive adhesive possesses satisfactory adhesive strength to the work piece before irradiation with energy radiation, and the adhesive strength is extremely decreased upon irradiation with energy radiation. That is, the work piece can be secured by satisfactory adhesive strength before irradiation with energy radiation, but, after irradiation with energy radiation, the resultant work piece can be easily peeled.

The other pressure sensitive adhesive layer 2b, namely the pressure sensitive adhesive layer provided on the side stuck to a hard plate, can be composed of various common pressure sensitive adhesives. These pressure sensitive adhesives are not limited at all. For example, use can be made of removable pressure sensitive adhesives such as rubber, acrylic, silicone, polyurethane and polyvinyl ether based pressure sensitive adhesives. However, in the present invention, the pressure sensitive adhesive layer 2b is also preferably composed of the above energy radiation curable pressure sensitive adhesive.

The thickness of each of the pressure sensitive adhesive layers 2a, 2b, although depending on the properties of the material used therein, is generally in the range of about 3 to 100 μm, preferably about 10 to 50 μm.

The above pressure sensitive adhesive double coated sheet 10 of the present invention is suitably used for the surface protection and wafer fixing during the grinding of the back of semiconductor wafers. Also, when a hard brittle work piece such as a glass/epoxy substrate, a glass or a ceramic is processed (for example, cut), the pressure sensitive adhesive double coated sheet 10 can be employed for temporarily holding the work piece on a hard plate. Examples of suitable hard plates include a glass plate, a quartz plate and plastic plates such as acrylic, polyvinyl chloride, polyethylene terephthalate, polypropylene and polycarbonate plates. The hardness, defined by ASTM D 883, of the hard plate is preferably at least 70 MPa. The thickness of the hard plate although depending on the properties of the material used therein is generally in the range of about 0.1 to 10 mm. When ultraviolet light is used as the energy radiation, the hard plate is composed of a material which is permeable for ultraviolet light.

The method of using the pressure sensitive adhesive double coated sheet of the present invention will be described in greater detail below with reference to the appended drawings.

Figure 2:
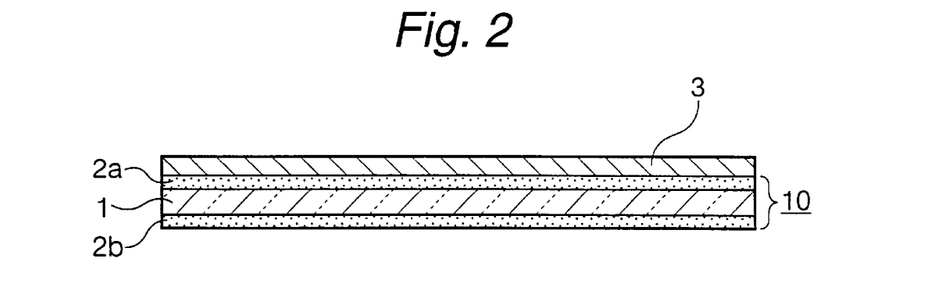
FIG. 2 is a view showing the sticking of a work piece to the pressure sensitive adhesive double coated sheet of the present invention.

Referring first to FIG. 2, work piece 3 is stuck to the energy radiation curable pressure sensitive adhesive layer 2a of the pressure sensitive adhesive double coated sheet 10. The work piece 3 is, for example, any of the above semiconductor wafer, hard brittle materials such as a glass/epoxy substrate, a glass and a ceramic, and various electronic components and optical parts to be processed, to which, however, the work piece 3 is not limited.

Figure 3:
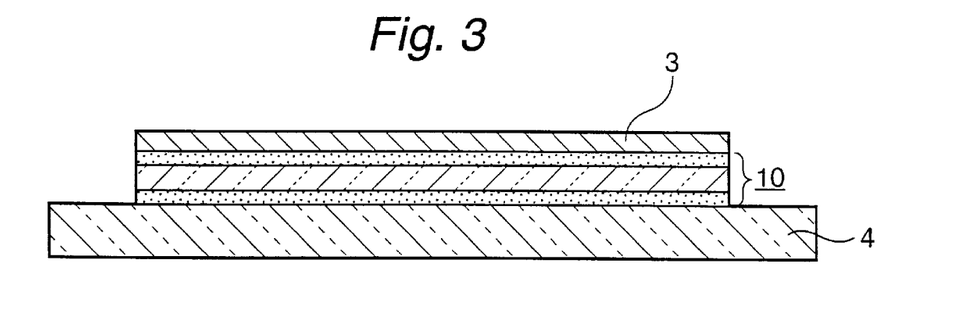
FIG. 3 is a view showing the fixing on a hard plate of the pressure sensitive adhesive double coated sheet having a work piece stuck thereto.

Referring now to FIG. 3, the other pressure sensitive adhesive layer 2b is stuck to hard plate 4, so that the work piece 3 is held on the hard plate 4. Alternatively, the other pressure sensitive adhesive layer 2b may first be stuck to the hard plate, followed by sticking of the work piece 3 to the energy radiation curable pressure sensitive adhesive layer 2a. In this instance, for preventing the occurrence of bubbles between the pressure sensitive adhesive layer 2b and the hard plate 4, it is preferred that the sticking of the pressure sensitive adhesive layer 2b to the hard plate 4 be performed in vacuum.

Thereafter, the desired processing of the work piece 3 is performed. For the semiconductor wafer, the processing is, for example, back grinding or dicing into element chips. For the glass/epoxy substrate, the processing is circuit formation or dicing into chips by each circuit. For the glass or ceramic, the processing is, for example, cutting or etching. While the processing is performed, a surface protection is simultaneously effected on the side of the work piece 3 brought into contact with the pressure sensitive adhesive layer 2a.

Figure 4:
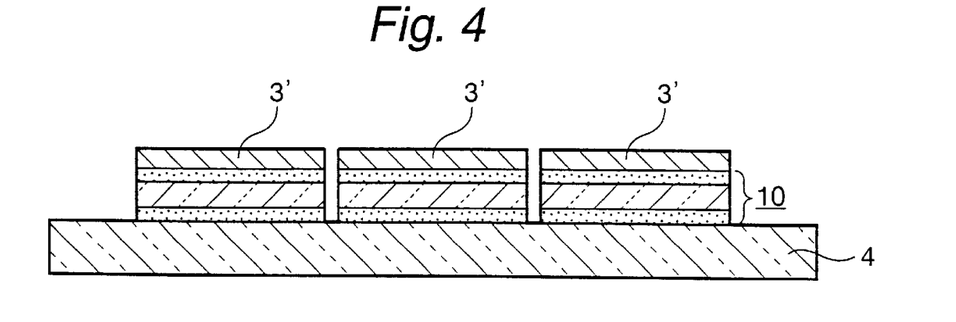
FIG. 4 is a view showing a processed work piece.

FIG. 4 shows, for example, the execution of circuit formation on a semiconductor wafer or a glass/epoxy substrate as the work piece 3 and dicing into chips by each circuit.

Dicing conditions, although not particularly limited, are preferably such that heat shrink substrate 1 is completely cut and divided. This cutting reduces the area of sticking to thereby enable shortening the peeling time. The depth of cut is preferably such that the cut ends at the pressure sensitive adhesive layer provided on the hard plate 4 side. The reason is that the hard plate 4 can be recycled as many times as desired if no cut is made in the hard plate 4.

Subsequently, not only is the adhesive strength of the energy radiation curable pressure sensitive adhesive layer 2a reduced by irradiating the layer from the hard plate 4 side with energy radiation so as to effect curing but also the shrink substrate 1 is shrunk by appropriate means. For example, if a heat shrink substrate is used, the shrink substrate 1 is shrunk by appropriately heating it. As a result, referring to FIG. 5, a shear force generated between the processed work piece 3' and the energy radiation curable pressure sensitive adhesive layer 2a having been cured by the shrinkage of the shrink substrate 1 initiates peeling. The peeling of the processed work piece 3' from the energy radiation curable pressure sensitive adhesive layer 2a having been cured is propagated from the periphery of bonded parts toward the center thereof. Finally, the peeling is effected throughout the bonded parts.

Furthermore, the pressure sensitive adhesive layer 2b is also transformed in accordance with the shrinkage of the shrink substrate 1, so that the pressure sensitive adhesive double coated sheet 10 can be easily removed from the hard plate 4. Especially when the pressure sensitive adhesive layer 2b is composed of the energy radiation curable pressure sensitive adhesive, the adhesive strength with the hard plate 4 is reduced by irradiation with energy radiation to thereby enable easily removing the pressure sensitive adhesive double coated sheet 10 from the hard plate 4.

Figure 6:
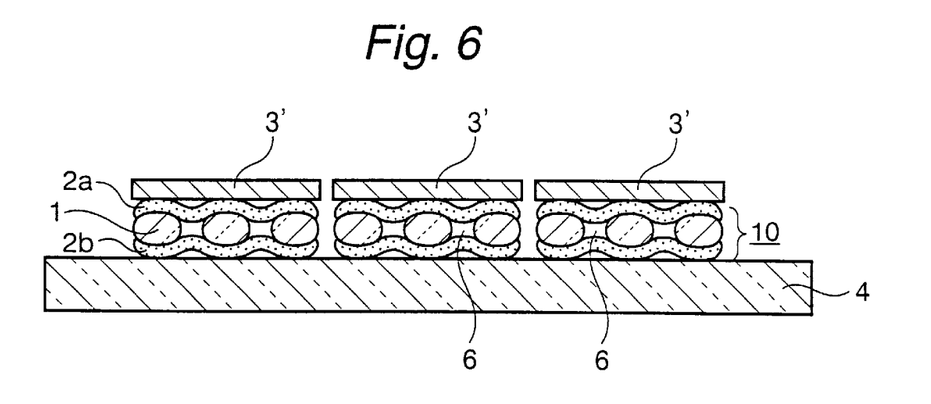
FIG. 6 is a view showing a mode of use of a pressure sensitive adhesive double coated sheet having its substrate furnished with cuts.

As aforementioned, in the pressure sensitive adhesive double coated sheet of the present invention, the shrink substrate 1 can be furnished with a multiplicity of minute cuts 6. In this instance, when the shrink substrate 1 is shrunk by, for example, heating after desired processing of the work piece 3, the energy radiation curable pressure sensitive adhesive layer 2a is transformed in accordance therewith to thereby reduce the area of contact with the processed work piece 3' with the result that the adhesive strength is reduced (see FIG. 6). Accordingly, the removal of the pressure sensitive adhesive double coated sheet 10 from the processed work piece 3' can be eased.

The pressure sensitive adhesive double coated sheet 10 of the present invention is especially preferably used in the method of grinding the back of a semiconductor wafer, comprising the following steps.

Figure 7:
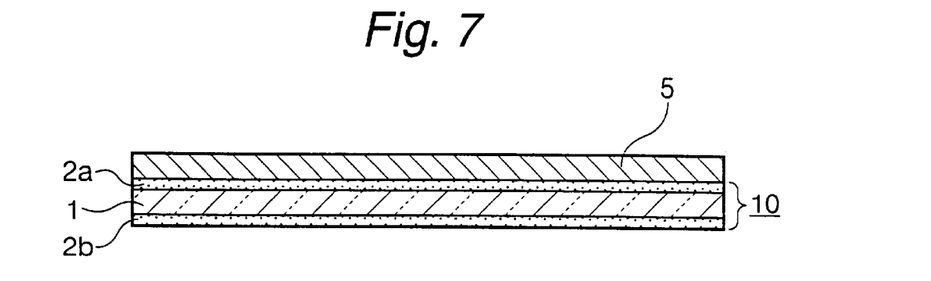
FIG. 7 is a view showing the sticking of a semiconductor wafer to the pressure sensitive adhesive double coated sheet of the present invention.

Referring first to FIG. 7, the circuit surface of semiconductor wafer 5 having its surface furnished with a circuit pattern is stuck to the energy radiation curable pressure sensitive adhesive layer 2a of the pressure sensitive adhesive double coated sheet 10 of the present invention.

Figure 8:
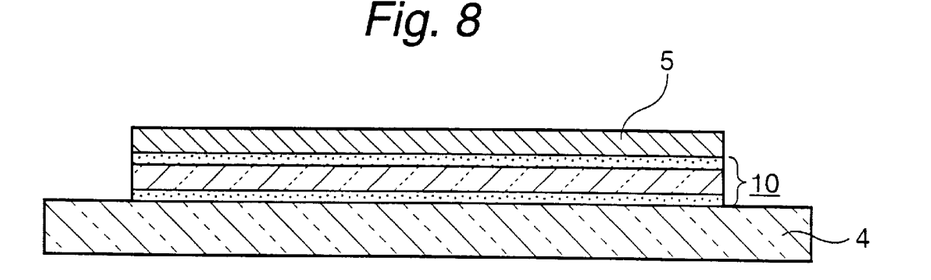
FIG. 8 is a view showing the fixing on a hard plate of the pressure sensitive adhesive double coated sheet having a semiconductor wafer stuck thereto.

Subsequently, referring to FIG. 8, the other pressure sensitive adhesive layer 2b is stuck to hard plate 4, so that the semiconductor wafer 5 is held on the hard plate 4.

Figure 9:
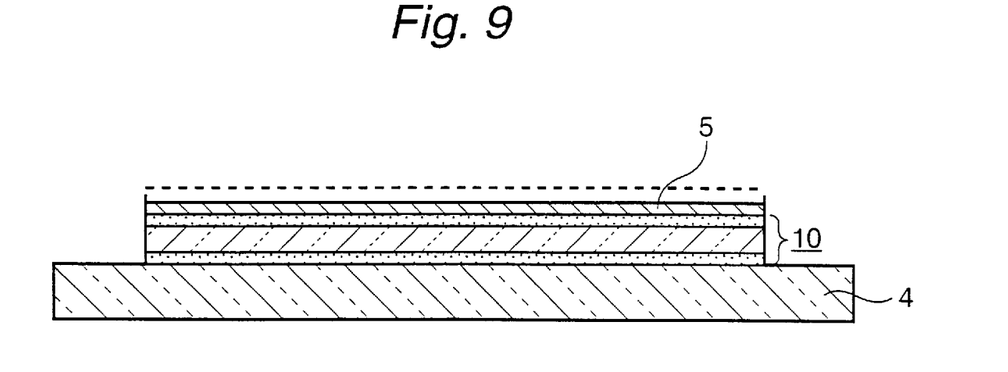
FIG. 9 is a view showing the state of composite after the grinding of the back of a semiconductor wafer.

In the state of being held on the hard plate 4, the semiconductor wafer 5 has its back ground to a desired thickness (see FIG. 9).

Thereafter, the irradiation with energy radiation and shrinkage of shrink substrate are performed in the same manner as mentioned above to thereby enable peeling of the semiconductor wafer 5 from the energy radiation curable pressure sensitive adhesive layer 2a having been irradiated and cured (see FIG. 10).

Alternatively, the wafer dicing as shown in FIG. 4 may be performed after grinding of the back of the semiconductor wafer 5, followed by the irradiation with energy radiation to thereby effect the substrate shrinkage. Thus, the back grinding and dicing can be performed in the same configuration, so that a process control can be facilitated. Further, the carrying of wafer between steps can be performed while the wafer is held on the hard plate, so that wafer breakage can be prevented.

Still alternatively, in the present invention, the back of element chips can be ground while the element chips are held on the hard plate after the execution of wafer dicing, contrary to the above.

As is apparent from the foregoing, the above pressure sensitive adhesive double coated sheet of the present invention enables temporarily holding various work pieces to be processed on a hard plate to thereby effect the fixing and protection thereof during processing. Also, the pressure sensitive adhesive double coated sheet of the present invention enables easily peeling the processed work pieces from the sheet by simple operation after the performing of desired processing and protection. Therefore, even if the pressure sensitive adhesive double coated sheet is used in the grinding of the back of, for example, an extremely thin or large-diameter semiconductor wafer, the wafer thickness precision can be enhanced and the warpage of the wafer can be reduced thereby. Further, the breakage during wafer carrying can be prevented. Consequently, the pressure sensitive adhesive double coated sheet of the present invention enables production of various electronic components and semiconductor chips with high yield. Moreover, a sequence of steps including machining and carrying can be performed in the same configuration in the present invention, so that the process control can be facilitated.

EXAMPLE

The present invention will further be illustrated below with reference to the following Examples which in no way limit the scope of the invention.

Example 1

1(1) 100 parts by weight of an acrylic pressure sensitive adhesive (copolymer of n-butyl acrylate and acrylic acid), 200 parts by weight of a urethane acrylate oligomer having a molecular weight of 7000, 10 parts by weight of a crosslinking agent (isocyanate type) and 10 parts by weight of an energy radiation curable reaction initiator (benzophenone type) were mixed together, thereby obtaining an energy radiation curable pressure sensitive adhesive composition (the elastic modulus thereof after ultraviolet irradiation was $1.5 \times 10^8$ Pa).

1(2) A 25 μm thick polyethylene terephthalate film having undergone release treatment was coated with the pressure sensitive adhesive composition obtained in the step 1(1) above so that the thickness of the coating was 10 μm and heated at 100° C. for 1 min, thereby forming an energy radiation curable pressure sensitive adhesive layer. Thereafter, the energy radiation curable pressure sensitive adhesive layer was stuck to a heat shrink polyethylene film (having a thickness of 35 μm and a shrinkage ratio of 65% at 1200° C.). Thus, there was obtained a sheet having one side applied to pressure sensitive adhesive layer.

1(3) Separately, a 25 μm thick polyethylene terephthalate film having undergone release treatment was coated with the pressure sensitive adhesive composition obtained in the step 1(1) above so that the thickness of the coating was 10 μm and heated at 1000° C. for 1 min, thereby forming another energy radiation curable pressure sensitive adhesive layer.

1(4) The heat shrink polyethylene film side of the sheet having one side applied to pressure sensitive adhesive layer, obtained in the step 1(2) above, was stuck to the pressure sensitive adhesive layer formed on the PET film in the step 1(3) above, thereby obtaining a pressure sensitive adhesive double coated sheet.

Example 2

The same procedure as in Example 1 was repeated except that the pressure sensitive adhesive composition applied to one side of the sheet was a removable pressure sensitive adhesive consisting of 100 parts by weight of an acrylic pressure sensitive adhesive (copolymer of n-butyl acrylate and 2-hydroxyethyl acrylate) and 10 parts by weight of a crosslinking agent (isocyanate type).

Example 3

A pressure sensitive adhesive double coated sheet was produced in the same manner as in Example 1 except that the shrink substrate was replaced by a heat shrink polyethylene terephthalate film (having a thickness of 30 μm and a shrinkage ratio of 40% at 120° C.).

Example 4

The same procedure as in Example 3 was repeated except that the pressure sensitive adhesive composition applied to one side of the sheet was a removable pressure sensitive adhesive consisting of 100 parts by weight of an acrylic pressure sensitive adhesive (copolymer of n-butyl acrylate and 2-hydroxyethyl acrylate) and 10 parts by weight of a crosslinking agent (isocyanate type).

Example 5

A sheet having one side applied to pressure sensitive adhesive layer was produced in the same manner as in the steps 1(1) and 1(2) of Example 1. By the use of a roller cutting die, this sheet was furnished, from the heat shrink film side of the sheet, with lengthwise and crosswise 2 mm-pitched grating cuts so that the cuts reached to a part of the pressure sensitive adhesive layer. Subsequently, a 25 μm thick polyethylene terephthalate film having undergone release treatment was coated with the same energy radiation curable pressure sensitive adhesive as used in the step 1(1) above so that the thickness of the coating was 10 μm and heated at 100° C. for 1 min. The resultant energy radiation curable pressure sensitive adhesive layer was stuck to the cut furnished heat shrink film side of the sheet, thereby obtaining a pressure sensitive adhesive double coated sheet including cut furnished shrink film.

Example 6

6(1) 100 parts by weight of an acrylic pressure sensitive adhesive (copolymer of n-butyl acrylate, methyl methacrylate and 2-hydroxyethyl acrylate), 150 parts by weight of a urethane acrylate oligomer having a molecular weight of 1000, 5 parts by weight of a crosslinking agent (isocyanate type) and 10 parts by weight of an energy radiation curable reaction initiator (benzophenone type) were mixed together, thereby obtaining an energy radiation curable pressure sensitive adhesive composition (the elastic modulus thereof after ultraviolet irradiation was $9.0 \times 10^8$ Pa).

6(2) A 25 μm thick polyethylene terephthalate film having undergone release treatment was coated with the pressure sensitive adhesive composition obtained in the step 6(1) above so that the thickness of the coating was 10 μand heated at 100° C. for 1 min, thereby forming an energy radiation curable pressure sensitive adhesive layer. Thereafter, the energy radiation curable pressure sensitive adhesive layer was stuck to a heat shrink polyethylene film (having a thickness of 35 μm and a shrinkage ratio of 65% at 120° C.). Thus, there was obtained a sheet having one side applied to the pressure sensitive adhesive layer.

6(3) 100 parts by weight of an acrylic pressure sensitive adhesive (copolymer of n-butyl acrylate and acrylic acid), 200 parts by weight of a urethane acrylate oligomer having a molecular weight of 7000, 10 parts by weight of a crosslinking agent (isocyanate type) and 10 parts by weight of an energy radiation curable reaction initiator (benzophenone type) were mixed together, thereby obtaining an energy radiation curable pressure sensitive adhesive composition (the elastic modulus thereof after ultraviolet irradiation was $1.5 \times 10^8$ Pa).

6(4) A 25 μm thick polyethylene terephthalate film having undergone release treatment was coated with the pressure sensitive adhesive composition obtained in the step 6(3) above so that the thickness of the coating was 10 μm and heated at 100° C. for 1 min, thereby forming another energy radiation curable pressure sensitive adhesive inlayer.

6(5) The heat shrink polyethylene film side of the sheet having one side applied to pressure sensitive adhesive layer, obtained in the step 6(2) above, was stuck to the pressure sensitive adhesive layer formed on the polyethylene terephthalate film in the step 6(4) above, thereby obtaining a pressure sensitive adhesive double coated sheet.

Example 7

A laminate shrink film exhibiting shrinkage ratios different from each other was produced in the following manner.

100 parts by weight of an acrylic pressure sensitive adhesive (copolymer of n-butyl acrylate and acrylic acid) and 10 parts by weight of a crosslinking agent (isocyanate type) were mixed together, thereby obtaining a pressure sensitive adhesive composition.

A 25 μm thick polyethylene terephthalate film having undergone release treatment was coated with the above obtained pressure sensitive adhesive composition so that the thickness of the coating was 5 μm and heated at 100° C. for 1 min, thereby forming a pressure sensitive adhesive layer. Thereafter, the pressure sensitive adhesive layer was stuck to a heat shrink polyethylene film (having a thickness of 30 μm and a shrinkage ratio of 40% at 1200° C.) Thus, there was obtained a sheet having one side applied to pressure sensitive adhesive layer.

While the release treated polyethylene terephthalate film of the obtained sheet was being peeled, the pressure sensitive adhesive layer was stuck to a heat shrink polyethylene film (having a thickness of 35 μm and a shrinkage ratio of 65% at 1200° C.), thereby obtaining a shrink film laminate.

A pressure sensitive adhesive double coated sheet was produced in the same manner as in Example 1 except that the heat shrink polyethylene film of Example 1 was replaced by the above obtained laminate film (thickness: 70 μm) exhibiting shrinkage ratios different from each other.

Comparative Example 1

A pressure sensitive adhesive double coated sheet having its both sides furnished with removable pressure sensitive adhesive layers was produced in the same manner as in Example 1 except that the energy radiation curable pressure sensitive adhesive composition was replaced by the removable pressure sensitive adhesive of Example 2.

Comparative Example 2

A pressure sensitive adhesive double coated sheet was produced in the same manner as in Example 1 except that the shrink substrate was replaced by a nonshrinkable polyethylene terephthalate film (having a thickness of 25 μm and a shrinkage ratio of 1% at 120° C.).

The thus obtained pressure sensitive adhesive double coated sheets were evaluated by the following method. The results are given in Table 1.

Evaluation Method
(1) Use as Protective Tape for Grinding:
One side of each of the pressure sensitive adhesive sheets produced in the Examples and Comparative Examples was peeled off the release film and stuck to a circuit side surface of a silicon wafer whose diameter and thickness were 6 inches (150 mm) and 700 μm, respectively. At that time, the energy radiation curable pressure sensitive adhesive layer of each pressure sensitive adhesive double coated sheet was stuck to the silicon wafer. Provided, however, that what was stuck to the silicon wafer was the energy radiation curable pressure sensitive adhesive layer whose elastic modulus after ultraviolet irradiation was $9.0 \times 10^8$ Pa in Example 6, the energy radiation curable pressure sensitive adhesive layer furnished on the side whose shrinkage ratio at 120° C. was 40% in Example 7, and the removable pressure sensitive adhesive layer in Comparative Example 1.

Subsequently, the other release film was peeled, and the thus exposed pressure sensitive adhesive layer was stuck to a glass plate (200 mm×200 mm×1.15 mm thickness) in vacuum.

After the sticking, the wafer back was ground until the thickness of the wafer was reduced to 50 μm. After the grinding, the glass side was irradiated with ultraviolet light (except Comparative Example 1), and, for 1 minute, each of the samples was placed on a hot plate having its surface heated to 120° C. A hook was secured to an upper part of each of the wafers with the use of an epoxy adhesive, and the peel strength from the glass surface was measured by means of a universal tensile tester (peel speed: 700 mm/min). The results are given in Table 1.

Further, the condition of sheet after heating was visually inspected. The results are given in Table 2.
(2) Use as Dicing Tape:
One side of each of the pressure sensitive adhesive sheets produced in the Examples and Comparative Examples was peeled off the release film and stuck to a specular surface of a silicon wafer (#2000 specular surface) whose diameter and thickness were 6 inches and 350 μm, respectively. At that time, the energy radiation curable pressure sensitive adhesive layer of each pressure sensitive adhesive double coated sheet was stuck to the silicon wafer. Provided, however, that the silicon wafer was stuck to the same pressure sensitive adhesive layer side as in the item (1) above in Examples 6 and 7 and Comparative Example 1.

Subsequently, the other release film was peeled, and the thus exposed pressure sensitive adhesive layer was stuck to a glass plate (200 mm×200 mm×1.15 mm thickness) in vacuum.

After the sticking, the wafer was diced into 10 mm□ by means of dicing apparatus DAD2H/6T (manufactured by Disco Corporation) with the use of dicing blade 27HECC so that the portion left uncut was 1.16 mm from the bottom face of the glass plate. After the dicing, the glass side was irradiated with ultraviolet light (except Comparative Example 1), and, for 1 minute, each of the samples was placed on a hot plate having its surface heated to 120° C. A hook was secured to an upper part of each chip with the use of an epoxy adhesive, and the peel strength from the glass surface was measured by means of a universal tensile tester (peel speed: 700 mm/min). The results are given in Table 1.

Further, the condition of sheet after heating was visually inspected. The results are given in Table 2.
(3) Use in a Sequence of Grinding, Carrying and Dicing:
One side of each of the pressure sensitive adhesive sheets produced in the Examples and Comparative Examples was peeled off the release film and stuck to a circuit side surface of a silicon wafer whose diameter and thickness were 6 inches and 700 μm, respectively. At that time, the energy radiation curable pressure sensitive adhesive layer of each pressure sensitive adhesive double coated sheet was stuck to the silicon wafer.

Provided, however, that the silicon wafer was stuck to the same pressure sensitive adhesive layer side as in the item (1) above in Examples 6 and 7 and Comparative Example 1.

Subsequently, the other release film was peeled, and the thus exposed pressure sensitive adhesive layer was stuck to a glass plate (200 mm×200 mm×1.15 mm thickness) in vacuum.

After the sticking, the wafer was ground until the thickness of the wafer was reduced to 50 μm. The ground wafer held in the same state was carried to a dicing step.

The thus ground wafer was diced into 10 mm□ by means of dicing apparatus DAD2H/6T (manufactured by Disco Corporation) with the use of dicing blade 27HECC so that the portion left uncut was 1.16 mm from the bottom face of the glass plate. After the dicing, the glass side was irradiated with ultraviolet light (except Comparative Example 1), and, for 1 minute, each of the samples was placed on a hot plate having its surface heated to 120° C. A hook was secured to an upper part of each chip with the use of an epoxy adhesive, and the peel strength from the glass surface was measured by means of a universal tensile tester (peel speed: 700 mm/min). The results are given in Table 1.

Further, the condition of sheet after heating was visually inspected. The results are given in Table 2.
(4) Use in a Sequence of Dicing, Carrying and Grinding:
One side of each of the pressure sensitive adhesive sheets produced in the Examples and Comparative Examples was peeled off the release film and stuck to a circuit side surface of a silicon wafer whose diameter and thickness were 6 inches and 700 μm, respectively. At that time, the energy radiation curable pressure sensitive adhesive layer of each pressure sensitive adhesive double coated sheet was stuck to the silicon wafer.

Provided, however, that the silicon wafer was stuck to the same pressure sensitive adhesive layer side as in the item (1) above in Examples 6 and 7 and Comparative Example 1.

Subsequently, the other release film was peeled, and the thus exposed pressure sensitive adhesive layer was stuck to a glass plate (200 mm×200 mm×1.15 mm thickness) in vacuum.

The wafer was diced into 10 mm□ by means of dicing apparatus DAD2H/6T (manufactured by Disco Corporation) with the use of dicing blade 27HECC so that the portion left uncut was 1.16 mm from the bottom face of the glass plate. After the dicing, the diced wafer held in the same state was carried to a grinding step.

The wafer was ground until the thickness of the wafer was reduced to 50 μm. After the grinding, the glass side was irradiated with ultraviolet light (except Comparative Example 1), and, for 1 minute, each of the samples was placed on a hot plate having its surface heated to 120° C. A hook was secured to an upper part of each chip with the use of an epoxy adhesive, and the peel strength from the glass surface was measured by means of a universal tensile tester (peel speed: 700 mm/min). The results are given in Table 1.

Further, the condition of sheet after heating was visually inspected. The results are given in Table 2.

TABLE 1

| | Evaluation Results | | | |
|---|---|---|---|---|
| | Evaluation conditions | | | |
| | (1) g/150 mm⌀ | (2) g/10 mm□ | (3) g/10 mm□ | (4) g/10 mm□ |
| Example 1 | 20 | 5 | 5 | 5 |
| Example 2 | 40 | 20 | 18 | 18 |
| Example 3 | 40 | 10 | 10 | 10 |
| Example 4 | 80 | 40 | 39 | 40 |
| Example 5 | 10 | 3 | 5 | 5 |
| Example 6 | 15 | 5 | 5 | 3 |
| Example 7 | 20 | 5 | 5 | 3 |
| Comp.Ex. 1 | wafer broken | wafer broken | wafer broken | wafer broken |
| Comp.Ex. 2 | wafer broken | wafer broken | wafer broken | wafer broken |

TABLE 2

| | Peeling Condition of Pressure Sensitive Adhesive Double Coated Sheet | | | |
|---|---|---|---|---|
| | Evaluation conditions | | | |
| | (1) | (2) | (3) | (4) |
| Example 1 | random | — | — | — |
| Example 2 | glass side | — | — | — |
| Example 3 | random | — | — | — |
| Example 4 | glass side | — | — | — |
| Example 5 | random | — | — | — |
| Example 6 | glass side | — | — | — |
| Example 7 | glass side | — | — | — |

TABLE 2-continued

| | Peeling Condition of Pressure Sensitive Adhesive Double Coated Sheet | | | |
|---|---|---|---|---|
| | Evaluation conditions | | | |
| | (1) | (2) | (3) | (4) |
| Comp.Ex. 1 | wafer broken | — | — | — |
| Comp.Ex. 2 | wafer broken | — | — | — |

Glass side: The pressure sensitive adhesive double coated sheet was transformed so as to protrude to the wafer (chip) side, and the pressure sensitive adhesive double coated sheet adhered to the glass side and did not remain on the wafer (chip) side.
Random: Transformation of the pressure sensitive adhesive double coated sheet randomly occurred. The pressure sensitive adhesive double coated sheet remained on both the wafer (chip) side and the glass side but was easily peeled by blow air pressure.

What is claimed is:

1. A method of using a pressure sensitive adhesive double coated sheet, comprising:
    sticking a work piece to be processed to an energy radiation curable pressure sensitive adhesive layer of a pressure sensitive adhesive double coated sheet comprising a shrink substrate and, superimposed on both sides thereof, pressure sensitive adhesive layers composed of an energy radiation curable pressure sensitive adhesive, while sticking one of the pressure sensitive adhesive layers to a hard plate having a hardness of at least 70 MPa defined by ASTM D883, so that the work piece is held on the hard plate;
    processing the work piece;
    irradiating the energy radiation curable pressure sensitive adhesive layers with energy radiation to cure the same and simultaneously shrinking the shrink substrate; and
    peeling the processed work piece from the energy radiation curable pressure sensitive adhesive layer having been irradiated and cured.

2. The method as claimed in claim 1, wherein the shrink substrate is furnished with a multiplicity of minute cuts.

3. The method as claimed in claim 1, wherein the work piece to be processed is a semiconductor wafer having its surface furnished with a circuit pattern, and the processing is grinding of a back of the semiconductor wafer.

4. The method as claimed in claim 1, wherein the work piece to be processed is a semiconductor wafer having its surface furnished with a circuit patter, and the processing is dicing of the semiconductor wafer into element chips.

5. The method as claimed in claim 1, wherein the work piece to be processed is a semiconductor wafer having its surface furnished with a circuit pattern, and the processing is grinding of a back of the semiconductor wafer and dicing of the semiconductor wafer into element chips, these being performed in arbitrary sequence.

6. A method of using a pressure sensitive adhesive double coated sheet, comprising:
    sticking a work piece to be processed to an energy radiation curable pressure sensitive adhesive layer of a pressure sensitive adhesive double coated sheet comprising a shrink substrate having a multiplicity of minute cuts and, superimposed on both sides thereof, pressure sensitive adhesive layers, at least one of the pressure sensitive adhesive layers being composed of an energy radiation curable pressure sensitive adhesive while sticking the other pressure sensitive adhesive layer to a hard plate having a hardness of at least 70 MPa defined by ASTM D883 so that the work piece is held on the hard plate;

processing the work piece;

irradiating the energy radiation curable pressure sensitive adhesive layer with energy radiation to cure the same and simultaneously shrinking the shrink substrate; and peeling the processed work piece from the energy radiation curable pressure sensitive adhesive layer having been irradiated and cured.

7. The method as claimed in claim 6, wherein both of the pressure sensitive adhesive layers are composed of an energy radiation curable pressure sensitive adhesive.

8. The method as claimed in claim 6, wherein the work piece to be processed is a semiconductor wafer having its surface finished with a circuit pattern, and the processing is grinding of a back of the semiconductor wafer.

9. The method as claimed in claim 6, wherein the work piece to be processed is a semiconductor wafer having its surface furnished with a circuit pattern, and the processing is dicing of the semiconductor wafer into element chips.

10. The method as claimed in claim 6, wherein the work piece to be processed is a semiconductor wafer having its surface furnished with a circuit pattern, and the processing is grinding of a back of the semiconductor wafer and dicing of the semiconductor wafer into element chips, these being performed in arbitrary sequence.

11. A method of using a pressure sensitive adhesive double coated sheet, comprising:

sticking a work piece to be processed to an energy radiation curable pressure sensitive adhesive layer of a pressure sensitive adhesive double coated sheet comprising a shrink substrate having a multiplicity of minute cuts and, superimposed on both sides thereof, pressure sensitive adhesive layers composed of an energy radiation curable pressure sensitive adhesive while sticking one of the pressure sensitive adhesive layers to a hard plate having a hardness of at least 70 MPa defined by ASTM D883, so that the work piece is held on the hard plate;

processing the work piece;

irradiating the energy radiation curable pressure sensitive adhesive layers with energy radiation to cure the same and simultaneously shrinking the shrink substrate; and peeling the processed work piece from the energy radiation curable pressure sensitive adhesive layer having been irradiated and cured.

12. The method as claimed in claim 11, wherein the work piece to be processed is a semiconductor wafer having its surface furnished with a circuit pattern, and the processing is grinding of a back of the semiconductor wafer.

13. The method as claimed in claim 11, wherein the work piece to be processed is a semiconductor wafer having its surface furnished with a circuit pattern, and the processing is dicing of the semiconductor wafer into element chips.

14. The method as claimed in claim 11, wherein the work piece to be processed is a semiconductor wafer having its surface furnished with a circuit pattern, and the processing is grinding of a back of the semiconductor wafer and dicing of the semiconductor wafer into element chips, these being performed in arbitrary sequence.

* * * * *

UNITED STATES PATENT AND TRADEMARK OFFICE
CERTIFICATE OF CORRECTION

PATENT NO. : 6,398,892 B1
DATED : June 4, 2002
INVENTOR(S) : Hayato Noguchi et al.

It is certified that error appears in the above-identified patent and that said Letters Patent is hereby corrected as shown below:

Column 1,
Line 56, "burden some" should read -- burdensome --.

Column 2,
Line 9, "It addition" should read -- In addition --.

Column 9,
Line 17, "at 1200° C" should read -- at 120° C --.
Line 23, "at 1000° C" should read -- at 100° C --.

Column 10,
Line 25, "10 $\mu$ and" should read -- 10 $\mu$m and --.
Line 48, "inlayer" should read -- layer --.

Column 11,
Line 12, "at 1200° C" should read -- at 120° C --.

Column 14,
Line 46, "circuit patter" should read -- circuit pattern --.

Column 15,
Line 17, "finished with" should read -- furnished with --.

Signed and Sealed this

Fifth Day of November, 2002

*Attest:*

JAMES E. ROGAN
*Director of the United States Patent and Trademark Office*

*Attesting Officer*